US007991813B2

(12) United States Patent
Chatterjee

(10) Patent No.: US 7,991,813 B2
(45) Date of Patent: Aug. 2, 2011

(54) METHODS AND SYSTEMS FOR EFFICIENT FILTERING OF DIGITAL SIGNALS

(75) Inventor: Chanchal Chatterjee, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 1536 days.

(21) Appl. No.: 11/214,548

(22) Filed: Aug. 29, 2005

(65) Prior Publication Data

US 2005/0289205 A1 Dec. 29, 2005

Related U.S. Application Data

(62) Division of application No. 10/057,694, filed on Jan. 23, 2002, now Pat. No. 7,177,889.

(51) Int. Cl.
*G06F 17/10* (2006.01)
(52) U.S. Cl. ........................................ 708/300
(58) Field of Classification Search .......... 708/300–500; 364/700–730; 382/200–300
See application file for complete search history.

(56) References Cited

U.S. PATENT DOCUMENTS

| | | | | |
|---|---|---|---|---|
| 5,710,732 | A * | 1/1998 | Wong | 708/445 |
| 5,903,313 | A | 5/1999 | Tucker et al. | |
| 6,512,523 | B1 * | 1/2003 | Gross | 345/606 |
| 6,687,771 | B2 * | 2/2004 | Symes | 708/313 |
| 6,711,597 | B1 * | 3/2004 | O'Donnell | 708/290 |
| 6,795,841 | B2 * | 9/2004 | Dijkstra | 708/445 |
| 6,889,242 | B1 | 5/2005 | Sijstermans et al. | |
| 7,558,816 | B2 | 7/2009 | Saulsbury et al. | |

OTHER PUBLICATIONS

"IA-32 Intel® Architecture Software Developer's Manual, vol. 1: Basic Architecture," Intel Corporation, P.O. Box 7641, Mt. Prospect IL 60056-7641, pp. iii to xii, 10-1 to 10-20, 11-1 to 11-36, (2002).
"IA-32 Intel® Architecture Software Developer's Manual, vol. 2: Instruction Set Reference," Intel Corporation, P.O. Box 7641, Mt. Prospect IL 60056-7641, pp. iii to xiii, 3-537 to 3-543, 3-545 to 3-547, 3-598 to 3-599, 3-625 to 3-633, 3-639 to 3-641, 3-657 to 3-658, (2002).
"Information technology—Coding of moving pictures and associated audio for digital storage media at up to about 1,5 Mbit/s—Part 2: Video," ISO/IEC Copyright Office, Case Postale 56, CH1211 Genève 20, Switzerland, pp. 1-17, 51-57, 77-105, (1993).
"VR5432 64-Bit MIPS® RISC Microprocessor," vol. 2, NEC Electronics Inc., U.S.A., pp. iii-xiii, 677-683, (2000).
"Using Streaming SIMD Extensions 2 (SSE2) in Motion Compensation for Video Decoding and Encoding Version 2.0," *AP-942 Using SSE2 in Motion Compensation for Video Decoding and Encoding*, Intel Corporation, P.O. Box 7641, Mt. Prospect IL 60056-7641, pp. 1-23, A-1 to A-3, (2000).
Web page, "Applications Tuning for Streaming SIMD Extensions (continued)," at URL=http:\\developer.intel.com/technology/itj/q21999/articles/art_5j.htm, printed Jun. 21, 2001.
Abel et al., "Applications: Tuning for Streaming SIMD Extenstions", Intel Tech. Journal, www.intel.com/technology/itj/q21999/pdf/apps_simd.pdf, pp. 1-13, XP-002249244.

* cited by examiner

*Primary Examiner* — Lewis A Bullock, Jr.
*Assistant Examiner* — Kevin Hughes
(74) *Attorney, Agent, or Firm* — Larry T. Cullen

(57) ABSTRACT

A method in a signal processor for filtering samples in a digital signal is provided. An approximate filtered sample is generated as a function of four samples of the digital signal. A correction is generated as a function of the four samples, and a filtered sample is generated by modifying the approximate filtered sample with the correction.

14 Claims, 13 Drawing Sheets

METHODS AND SYSTEMS FOR EFFICIENT FILTERING OF DIGITAL SIGNALS

This is a divisional application of U.S. application Ser. No. 10/057,694 filed on Jan. 23, 2002 now U.S. Pat. No. 7,177,889.

COPYRIGHT NOTICE

Portions of the disclosure recited in this specification contain material which is subject to copyright protection. Specifically, source code instructions by which specific embodiments of the present invention are practiced in a computer system are included. The copyright owner has no objection to the facsimile reproduction of the specification as filed in the Patent and Trademark Office. Otherwise all copyright rights are reserved.

BACKGROUND OF THE INVENTION

The present invention relates generally to techniques for performing integer arithmetic, and, more particularly, for performing quantization and prediction calculations in video encoders and decoders.

In video communication (e.g., television, video conferencing, streaming media, etc.), a stream of video frames are transmitted over a transmission channel to a receiver. Depending on the particular application, audio information associated with the video may also be transmitted. Video data is generally voluminous. For example, typical television images have spatial resolution of approximately 720*480 pixels per frame. If 8 bits are used to digitally represent a pixel, and if the video is to be transmitted at 30 frames per second, then a data rate of approximately 83 Mbits per second would be required. However, the bandwidth of transmission channels are typically limited. Thus, the transmission of raw digital video data in real-time is generally not feasible. Similarly, the storage of raw digital video data is prohibitive because the amount of memory for storage is typically limited.

Consequently, video data is generally compressed prior to transmission and/or storage. Various standards for video compression have emerged, including H.261, MPEG-1, MPEG-2, MPEG-4, H.263, and the like. Compression techniques generally exploit the redundancy of information, both within each picture of a stream of video and between pictures in the stream. For example, one commonly used technique for compressing video data involves performing a mathematical transform (e.g., discrete cosine transform) on the picture data, which transforms the picture data into the 2-dimensional spatial frequency domain. Then, the transformed picture data is quantized (i.e., the resolution of the data is reduced so that less bits are required to represent the data), taking advantage of the fact that human sight is generally less sensitive to higher spatial frequencies (i.e., transformed picture data corresponding to higher spatial frequencies are more severely quantized than transformed video data corresponding to lower spatial frequencies). At the receiver, the inverse transform is applied to the received video data to regenerate the video.

In another common technique, rather than transmitting a new picture in the video stream, the difference between the new picture and a previous picture is transmitted. Because successive pictures in a video stream are often similar, the difference information can be transmitted using much less bits than would be required to transmit the picture itself.

The number of bits required to transmit video can be further reduced using prediction techniques at the encoder and decoder. For instance, the encoder can "predict" a current picture in the video stream based on a previous picture, and then calculate the error between its prediction and the actual picture. The error between a predicted picture and the actual picture will tend to be smaller than the error between the actual picture and a previous picture. Because the error is smaller, less bits are needed to represent the error, thus, reducing the amount of bits that need to be transmitted. At the receiver, a decoder generates a predicted picture and combines it with the received error information to generate the actual picture.

One technique for generating a prediction of a picture in a video stream involves motion estimation. In one motion estimation technique, a current picture is partitioned into 8-by-8 blocks of pixels. For each block, a best fit to the block is searched for within a reference picture, such as, for example, another actual or predicted picture in the video stream that is adjacent to the current picture. Once a best fit is found, a motion vector is determined that basically indicates where in the reference picture the best fit block is located. Then, the motion vector and errors for each block of the frame are transmitted to the receiver. At the receiver, the current picture is reconstructed using the reference picture, the motion vectors and the error information.

Techniques similar to those described above, as well as other techniques, can be combined to achieve greater degrees of compression without reducing video quality beyond a desired level. For example, in the MPEG-1, MPEG-2, and MPEG-4 standards, pictures in the video stream are predicted, and the difference between the actual picture and the predicted picture are calculated. Then, the discrete cosine transform (DCT) of the difference is calculated, and the DCT coefficients are quantized.

In typical video systems, video data are represented and processed as integers. What is needed are more efficient techniques for processing fixed-point data.

BRIEF SUMMARY OF THE INVENTION

In one embodiment according to the invention, a method in a signal processor for filtering samples in a digital signal is provided. The method comprises generating an approximate filtered sample as a function of less than four samples of the digital signal. The method also comprises generating a correction as a function of the less than four samples, and generating a filtered sample by modifying the approximate filtered sample with the correction.

In another embodiment according to the invention, a computer program product comprising a computer readable storage medium having computer program code embodied therein for quantizing a digital signal is provided. The computer program code includes code for generating an approximate filtered sample as a function of less than four samples of the digital signal. The computer program code also includes code for generating a correction as a function of the less than four samples, and code for generating a filtered sample by modifying the approximate filtered sample with the correction.

In yet another embodiment according to the invention, a system for filtering samples in a digital signal is provided. The system comprises a memory that stores samples in the digital signal, and a processor coupled to the memory. The processor is operable to perform the step of A) generating an approximate filtered sample as a function of less than four samples of the digital signal. The processor is also operable to perform the steps of B) generating a correction as a function of the less than four samples, and C) generating a filtered sample by modifying the approximate filtered sample with the correction.

In a second aspect according to the invention, another method in a signal processor for filtering samples in a digital signal is provided. The method comprises generating an approximate filtered sample as a function of a first sample, A, a second sample, B, a third sample, C, and a fourth sample, D, wherein A, B, C, and D are fixed-point numbers. The method additionally comprises generating a correction as $((A \oplus B)$ $AND(C \oplus D))OR(M \oplus N)$, wherein $M=A+B+1>>1$ and $N=C+D+1>>1$, and masking the correction. The method further comprises generating a filtered sample by modifying the approximate filtered sample with the correction.

In another embodiment according to the invention, a computer program product comprising a computer readable storage medium having computer program code embodied therein for quantizing a digital signal is provided. The computer program code includes code for generating an approximate filtered sample as a function of a first sample, A, a second sample, B, a third sample, C, and a fourth sample, D, wherein A, B, C, and D are fixed-point numbers, and code for generating a correction as $((A \oplus B)AND(C \oplus D))OR(M \oplus N)$, wherein $M=A+B+1>>1$ and $N=C+D+1>>1$. The computer program code also includes code for masking the correction, and code for generating a filtered sample by modifying the approximate filtered sample with the correction.

In a third aspect according to the present invention, yet another method in a signal processor for filtering samples in a digital signal is provided. The method comprises generating an approximate filtered sample as a function of a first sample, A, a second sample, B, a third sample, C, and a fourth sample, D, wherein A, B, C, and D are integers. The method also comprises generating a correction as $(A \oplus B)OR(C \oplus D)OR(M \oplus N)$, wherein $M=A+B+1>>1$ and $N=C+D+1>>1$, and masking the correction. The method additionally comprises generating a filtered sample by modifying the approximate filtered sample with the correction.

In a fourth aspect according to the invention, still another method in a signal processor for filtering samples in a digital signal is provided. The method comprises generating $M1=(A+B+1)>>1$, wherein A and B are samples in the digital signal, and generating $M2=(C+D+1)>>1$, wherein C and D are samples in the digital signal. The method also comprises generating $M3=(E+F+1)>>1$, wherein E and F are samples in the digital signal, and generating $M4=(G+H+1)>>1$, wherein G and H are samples in the digital signal. The method additionally comprises generating $N1=(M1+(M3>>1)+(M3>>2))>>2$, and generating $N2=(M2+(M2>>1)+(M4>>2))>>2$. The method further comprises generating a filtered sample as $M1+N1-N2$.

Numerous benefits are achieved by way of the present invention. For example, in a specific embodiment, filtering of digital samples are performed with less computational expense as compared to conventional filtering techniques. Other features and advantages of the invention will be apparent from the following detailed description and appended drawings.

DETAILED DESCRIPTION OF THE INVENTION

System Overview

Figure 1:
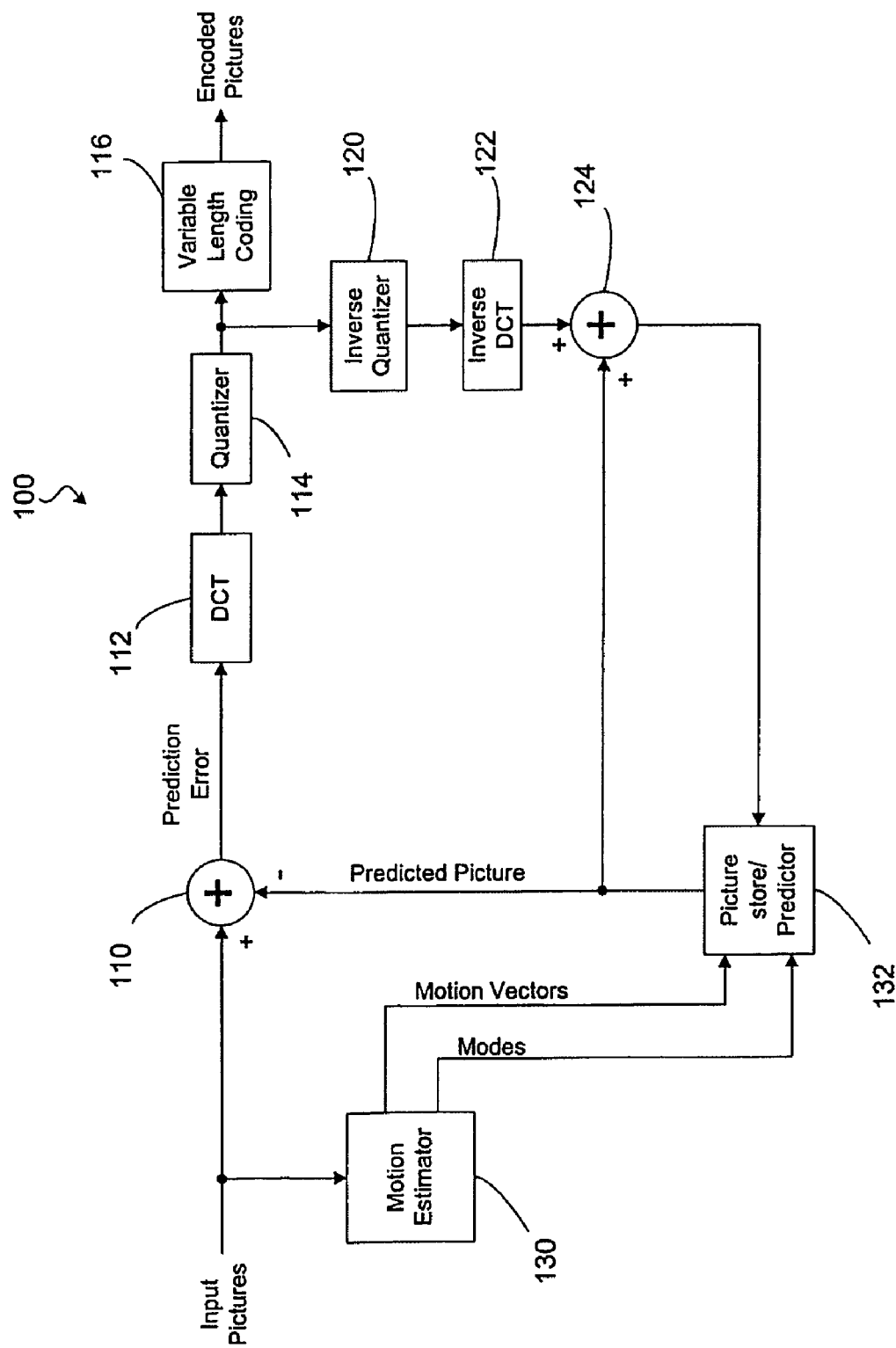
FIG. 1 is a simplified data flow diagram of an example of a video encoder.

FIG. 1 is a simplified data flow diagram of an example of a video encoder 100 in which some embodiments of the present invention may be utilized. Video encoder 100 receives video data to be encoded and generates encoded video. The video to be encoded comprises a series of pictures, and video encoder 100 generates a series of encoded pictures. A picture might be, for example, a frame of non-interlaced video (sometimes referred to as a field of non-interlaced video), a frame of interlaced video, a field of interlaced video, etc. Each input picture comprises an array of pixels, and each pixel is typically represented as an unsigned integer, typically using eight of sixteen bits. Each input picture is provided to a subtractor 110 that subtracts from the input picture a predicted picture to produce a prediction error. Predicted pictures are generated by a predictor 132.

As is well known to those skilled in the art, not all pictures in a video stream need be encoded using prediction. Thus, for some pictures, predictor 132 does not generate a predicted picture. Pictures encoded without prediction will hereinafter be referred to as "Intra" pictures, and pictures encoded with prediction will hereinafter be referred to as "Non-Intra" pictures. Therefore, for Intra pictures, the prediction error is merely the input picture.

The prediction error is then provided to a discrete cosine transform (DCT) calculator 112 that generates the DCT coefficients of the prediction error. The DCT coefficients are provided to a quantizer 114 that quantizes the DCT coefficients. With typical video information, many of the quantized DCT coefficients generated by quantizer 114 are often zero. The quantized DCT coefficients are provided to a variable length coder 116 that encodes the quantized DCT coefficients using, for example, a Huffman code or the like, to produce an encoded picture.

The quantized DCT coefficients generated by quantizer 114 are also provided to an inverse quantizer 120, and the output of the inverse quantizer is provided to an inverse DCT calculator 122. Inverse DCT calculator 122 generates a decoded prediction error that is provided to an adder 124. Adder 124 adds the decoded prediction error with a corresponding predicted picture to generate a decoded picture. The input pictures are also provided to a motion estimator 130 that generates motion vectors and mode information which are provided to predictor 132. Predictor 132 generates predicted pictures based on the motion vectors, mode information, and decoded pictures.

Figure 2:
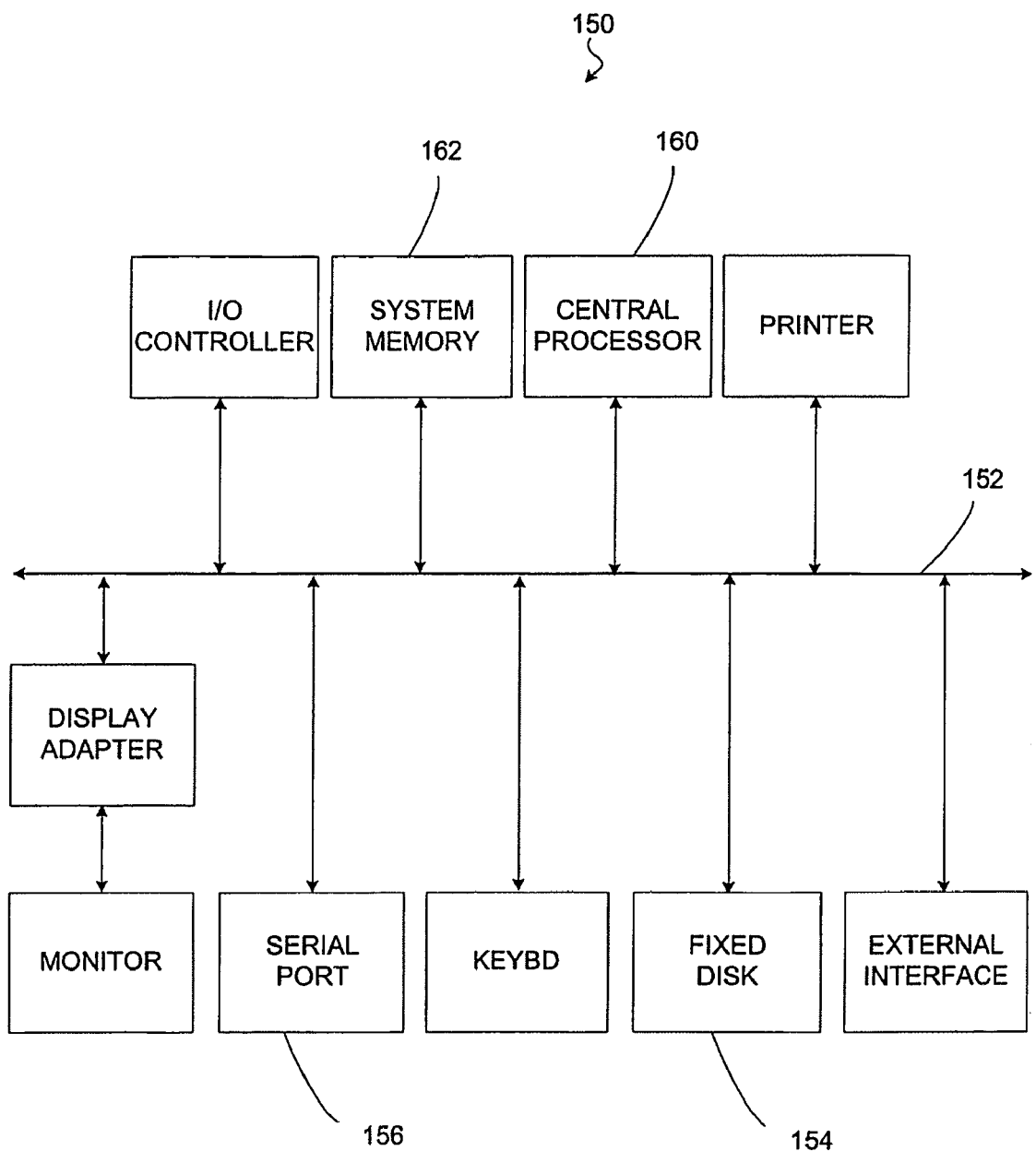
FIG. 2 is a simplified block diagram illustrating basic subsystems in a representative computer system in which methods according to various embodiments of the invention can be implemented.

A video encoder, such as, for example, encoder 100 illustrated in FIG. 1, can be implemented in hardware, software, or in a combination of hardware and software. FIG. 2 is a simplified block diagram of a representative computer system 150 on which software can be executed that implements some or all of the encoder elements illustrated in FIG. 1. This diagram is merely an illustration and should not limit the scope of the claims herein. One of ordinary skill in the art will recognize other variations, modifications, and alternatives.

In certain embodiments, the subsystems are interconnected via a system bus 152. Additional subsystems such as a printer, keyboard, fixed disk 154 and others are shown. Peripherals and input/output (I/O) devices can be connected to the computer system by any number of means known in the art, such as serial port 156. For example, serial port 156 can be used to connect the computer system to a modem, which in turn connects to a wide area network such as the Internet. The interconnection via system bus 152 allows central processor 160 to communicate with each subsystem and to control the execution of instructions from system memory 162 or the fixed disk 154, as well as the exchange of information between subsystems. Other arrangements of subsystems and interconnections are readily achievable by those of ordinary skill in the art. System memory 162, and the fixed disk 154 are examples of tangible media for storage of computer programs. Other types of tangible media include floppy disks, removable hard disks, optical storage media such as CD-ROMS and bar codes, and semiconductor memories such as flash memory, read-only-memories (ROM), and battery backed memory.

Central processor 160 may be any processor suitable for handling the throughput required for a particular video encoding implementation. For example, the central processor 160 can be a single instruction multiple data (SIMD) processor such as, for example, an Intel™ processor with MMX™ media enhancement technology and Streaming SIMD Extensions (SSE) or Streaming SIMD Extensions 2 (SSE2) (hereinafter "Intel™ processor with MMX™/SSE"), an NEC VR5234 processor, an Equator MAP-CA™ processor, a Philips TM-1300 processor, etc.

Motion Estimation/Compensation

Motion estimation/compensation is a family of techniques used in compressing/decompressing video data that take advantage of the similarity between pictures in a video stream. Typically, motion estimation refers to techniques applied during encoding, and motion compensation refers to techniques applied during decoding. In these techniques, a current picture is "predicted" using one or more previous or subsequent pictures.

In motion estimation, a picture to be "predicted" is often partitioned into blocks of pixels referred to as macroblocks. For each macroblock, a block of pixels (referred to as a reference block) in an adjacent picture (referred to as a reference picture) that is similar to the macroblock is chosen. The location of the similar block within the reference picture is indicated by a motion vector. Then, instead of sending to the receiver the macroblock itself, the difference between the macroblock and the reference block is sent, along with the motion vector. At the receiver, the macroblock can be reconstructed by locating the reference block using the motion vector, and then modifying it with the difference information.

Many techniques for choosing a reference block within a reference picture have been developed. Typically, a reference block is chosen by attempting to minimize a cost function that measures the mismatch between the macroblock and the reference block. In many techniques, a reference block may be chosen that is positioned with sub-pixel accuracy. For example, in half-pixel motion estimation (sometimes referred to as half sample mode), a reference block may be located with a resolution of a half-pixel. In half sample mode, if a reference block is located at a half-pixel boundary, then pixels making up the reference block are determined by interpolating between pixels in the reference picture. For example, if a pixel in the reference block is located between two actual pixels, then the value of the pixel in the reference block can be chosen as the average of the two actual pixels. If a pixel in the reference block is located at the center of four actual pixels, then the value of the pixel in the reference block can be chosen as the average of the four actual pixels. Thus, in half sample mode, pixels making up the reference block are determined by interpolating between pixels in the reference picture.

In quarter-pixel motion estimation, (sometimes referred to as quarter sample mode), a reference block may be located with a resolution of a quarter-pixel. As with half sample mode, if a reference block is located at a half-pixel or quarter pixel boundary, then pixels making up the reference block are determined by interpolating between pixels in the reference picture. As is known to those skilled in the art, generating a pixel located at a quarter-pel boundary is typically performed by filtering a plurality of the pixels in the reference picture.

Global motion compensation (GMC) is another technique used for motion estimation/compensation. As is known to those skilled in the art, GMC uses global spatial transformation to generate a predicted macro block based on a reference picture. As is known to those skilled in the art, the GMC transformation typically involves filtering a plurality of the pixels in the reference picture to generate a predicted pixel.

The present disclosure describes embodiments of techniques that can be used for efficient interpolation and/or filtering of pixels.

Efficient Averaging of Two Pixels

As described above, video encoding and decoding often requires that an interpolation between two or more pixels and/or a filtering of a plurality of pixels be calculated. Intel™ processors with MMX™/SSE provide instructions that are useful for efficiently calculating such interpolations: the packed average instructions PAVGB (8-bit numbers) and PAVGW (16-bit numbers). The packed average instructions operate on operands that are "packed" into 64-bit or 128-bit registers or memory locations. These instructions calculate the average of two unsigned integers A and B as $(A+B+1)\gg 1$, where the operator ">>1" indicates a right-shift by one bit. Thus, the packed average instruction sums A and B and one, and then right-shifts the result by one bit.

The result of $[(A+B+1)\gg 1]$, where A and B are n-bit integers, can be represented with n-bits. However, the sum of n-bit fix-point numbers A and B can result in an overflow (i.e., n+1 bits are required to represent the sum). Such an overflow would lead to an error in calculating $(A+B+1)\gg 1$, if the sum $(A+B+1)$ were first calculated and then right-shifted. Therefore, Intel™ processors with MMX™/SSE take this into account in executing the packed average instructions so that the correct result is produced even if the sum of A+B+1 would result in an overflow. Particularly, with the PAVGB instruction, the intermediate sum $(A+B+1)$ is computed as a 9-bit number, and with the PAVGW instruction, the intermediate sum $(A+B+1)$ is computed as a 17-bit number.

By adding one to the sum of A and B prior to the right-shift by one, the result of the operation is rounded up to the nearest integer. For example, if A is 3 and B is 4, then the floating point result of the average A and B is 3.5. The packed average instruction would generate a result of 4. Thus, the packed average instruction rounds the floating point result 3.5 up to 4.

Figure 3:
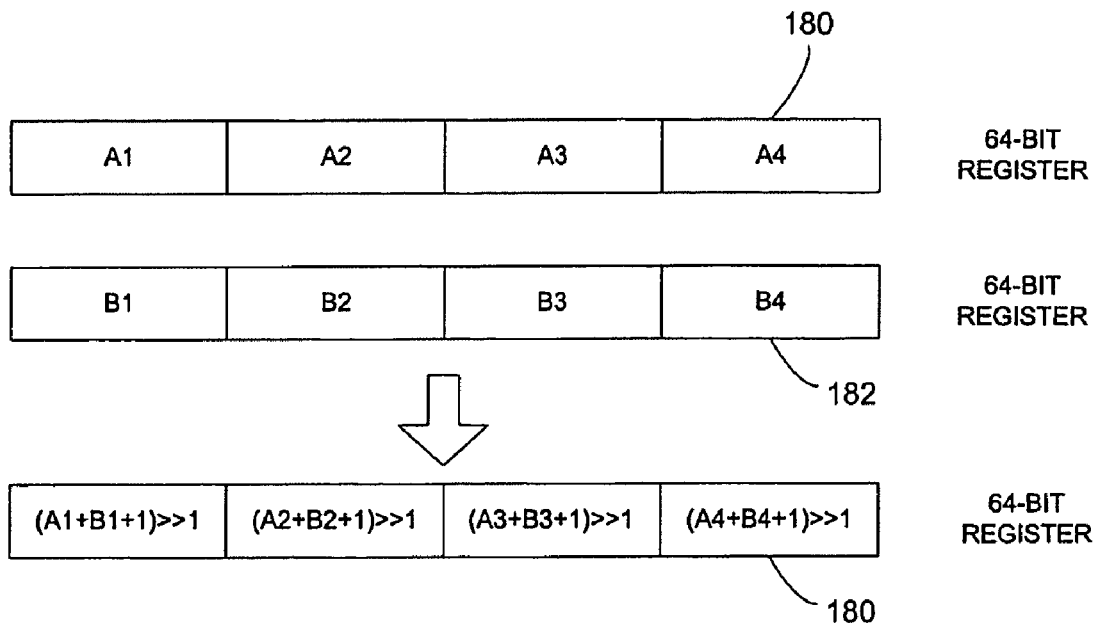
FIG. 3 is a simplified diagram illustrating the operation of a packed average instruction of an Intel™ processor with Streaming SIMD Extensions (SSE) or with Streaming SIMD Extensions 2 (SSE2)

FIG. 3 is a simplified diagram illustrating the operation of the PAVGW instruction. In this example, the operands to the PAVGW instruction are stored in 64-bit registers 180 and 182, and the result of the operation are stored back into register 180. Prior to execution of the instruction, register 180 includes four unsigned fixed-point 16-bit numbers A1, A2, A3 and A4 that are "packed" into the register. Similarly, register 182 includes four packed unsigned fixed-point 16-bit numbers B1, B2, B3 and B4. The function $(A+B+1)\gg 1$ is then calculated on each corresponding pair of numbers in registers 180 and 182, and the results are then stored in register 180 as packed unsigned fixed-point 16-bit numbers, as shown in FIG. 3.

Figure 4:
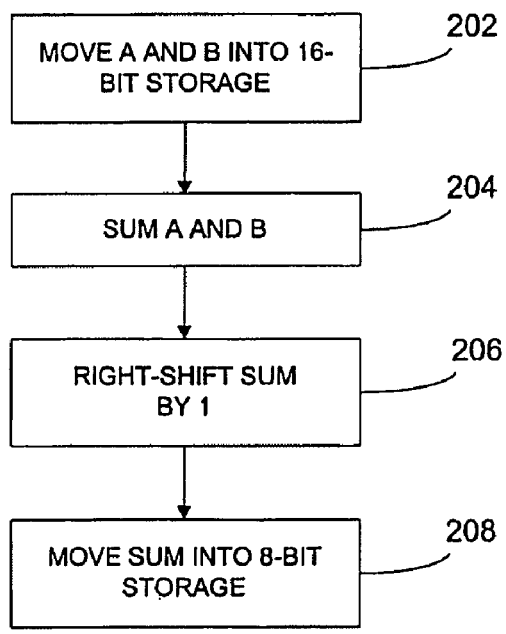
FIG. 4 is a simplified flow diagram illustrating a conventional method for computing the operation $(A+B)>>1$, where A and B are unsigned 8-bit integers.

In some cases, however, it may be desired to round the floating point result of an average of two integers towards zero (i.e., compute $(A+B)\gg 1$). General purpose processors, such as Intel™ processors, do not provide an instruction that performs such an operation. Thus, such a calculation must be performed using multiple instructions. FIG. 4 is a simplified flow diagram illustrating a conventional method for computing the operation $(A+B)\gg 1$, where A and B are unsigned 8-bit integers. First, in step 202, the values A and B are moved into 16-bit storage locations so that their addition can be performed using 16 bits. As described above, the sum of two 8-bit integers can result in an overflow. Thus, 16 bits are used to avoid overflow errors. Then, in step 204, the numbers A and B are summed. Next, in step 206, the sum is right-shifted by one bit. Finally, in step 208 the result is stored in an 8-bit storage location.

An example of computer code (Intel™ IA-32 assembly language) that implements $(A+B)\gg 1$ according to conventional methods (i.e., the flow of FIG. 4) is provided below. In this example computer code, fixed-point 8-bit values A1, A2, . . . are packed into register mm0 and fixed-point 8-bit values B1, B2, . . . are packed into register mm1. The values $(A1+B1)\gg 1$, $(A2+B2)\gg 1$, . . . are calculated and stored as packed fixed-point 8-bit values:

| | | |
|---|---|---|
| movq | mni2, mm0 | ;//mm2 = A |
| punpcklbw | mm0, 0 | ;//unpack the lower 4 bytes into |
| | | ;//mm0 |
| punpckhbw | mm2, 0 | ;//unpack the higher 4 bytes into |
| | | ;//mm2 |
| movq | mm3, mm1 | ;//mm3 = B |
| punpcklbw | mm 1, 0 | ;//unpack the lower 4 bytes into |
| | | ;//mm1 |
| punpckhbw | mm3, 0 | ;//unpack the higher 4 bytes into |
| | | ;//mm3 |
| paddw | mm0, mini | ;//mm0 = A + B (lower 4 bytes) |
| paddw | mm2, mm3 | ;//mm2 = A + B (upper 4 bytes) |
| psrlw | mm0, 1 | ;//mm0 = (A+B)>> 1 (lower) |
| psrlw | mm2, 1 | ;//mm2 = (A+B)>> 1 (upper) |
| packuswb | mm0, mm2 | ;//pack words into bytes of mm0 |

As can be seen in this example, 11 instructions are used to compute $(A+B)\gg 1$.

Figure 5:
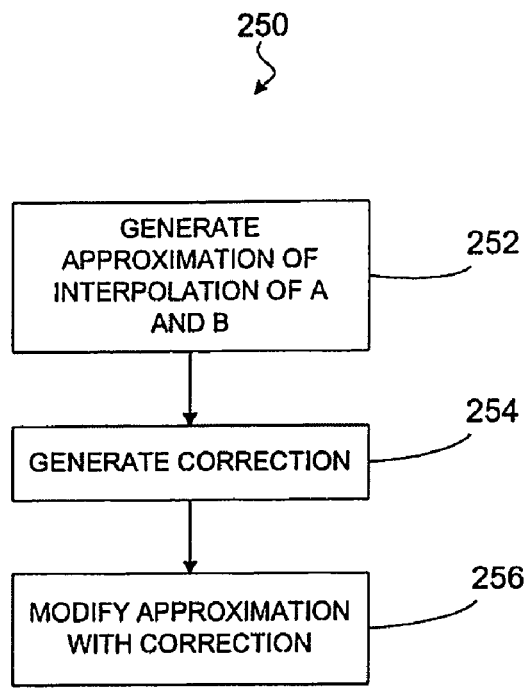
FIG. 5 is a simplified flow diagram of a method for interpolating between two values A and B according to one embodiment of the invention.

FIG. 5 is a simplified flow diagram illustrating one embodiment of a method according to the present invention. Particularly, FIG. 5 illustrates a method 250 that can be used to generate an interpolation between two values A and B according to some desired function. For example, the desired function can be $(A+B)\gg 1$. In step 252, an approximation of an interpolation is generated based on A and B. In step 254, a correction is generated based on A and B. Then, in a step 256, the approximation generated in step 252 is modified with the correction generated in step 254 to generate the interpolation value according to the desired function.

Figure 6:
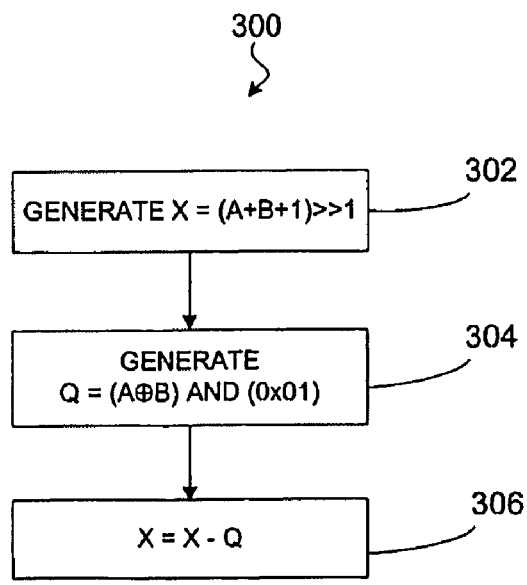
FIG. 6 is a simplified flow diagram of a method for generating an interpolation between two integers A and B according to one embodiment of the invention.

FIG. 6 is a simplified flow diagram illustrating one specific embodiment according to the present invention. Particularly, FIG. 6 illustrates a method 300 for generating an interpolation between two integers A and B according to the desired function $(A+B)\gg 1$. In step 302, an approximation, X, of $(A+B)\gg 1$ is generated as $(A+B+1)\gg 1$. In step 304, a correction, Q, is generated as the bit-wise exclusive-OR (hereinafter referred to as "XOR", or "⊕") of A and B, and further bit-wise ANDed with the mask 0x01. One skilled in the art will recognize that the correction Q generated in step 304 will have a value 0 or 1 depending upon the values of A and B. Then, in step 306, the correction Q is subtracted from the approximation X to generate the interpolation according to the desired function $(A+B)\gg 1$.

As described above, the Intel™ IA-32 processor provides the packed average instructions for calculating $(A+B+1)\gg 1$. Thus, in implementations using the an IA-32 processor, step 302 of FIG. 6 can be performed using a packed average instruction. An example of computer code (Intel™ IA-32 assembly language) that implements the flow illustrated in FIG. 6 is provided below. In this example computer code, 8-bit integers A1, A2, . . . are packed into register mm0 and 8-bit integers B1, B2, . . . are packed into register mm1. The values (A1+B1)>>1, (A2+B2)>>1, . . . are calculated and stored as packed 8-bit integers:

| movq | mm2,mm0 | ;//mm2 = A |
|---|---|---|
| pxor | mm2,mm1 | ;//mm2 = A⊕B |
| pand | mm2,mm_0101 | ;//mm2 = Q = (A⊕B)AND 0x01 |
| pavgb | mm0,mm1 | ;//mm0 = X = (A + B + 1) >>1 |
| psub | m0,mm2 | ;//mm0 = X − Q | where mm_0101 is the constant that includes packed 8-bit values 0x01, e.g., for eight packed integers, mm_0101 is 0*0101010101010101. As can be seen in this example, 5 instructions are used to compute (A+B)>>1. In comparison, the traditional computer code example described above with respect to FIG. 4 required 11 instructions. Thus, this specific embodiment provides an approximate speed improvement of 120% (11 instructions/5 instructions).

Efficient Averaging of Four Pixels

The above-described embodiments provide methods for efficiently interpolating or averaging two pixel values. In video encoding and decoding, it is also often necessary to average four pixel values. In motion estimation/compensation for example, it may be necessary to interpolate a pixel value at the center of a two-by-two array of pixels. For example, it may be desired to calculate the interpolation between four fixed-point pixel values A, B, C and D, according to the function (A+B+C+D)>>2. This function rounds the floating point average of the four values towards zero. Similarly, it may be desired to calculate the interpolation between four fixed-point pixel values A, B, C and D, according to the function (A+B+C+D+1)>>2. This function rounds the floating point average of the four values towards zero if the floating point average is less than 0.75 above an integer. Otherwise, the floating point average is rounded away from zero. For example, a floating point average of 3.5 is rounded to 3, whereas a floating point average of 3.75 is rounded to 4.

Figure 7:
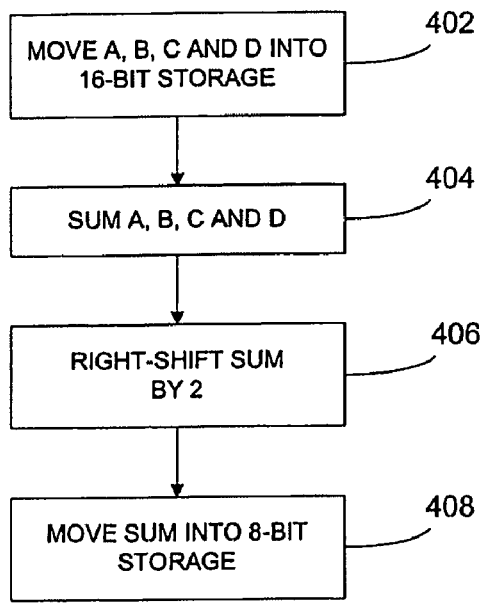
FIG. 7 is a simplified flow diagram illustrating a conventional method for computing the operation $(A+B+C+D)>>2$, where A, B, C and D are unsigned 8-bit integers.

FIG. 7 is a simplified flow diagram illustrating a conventional method for computing the operation (A+B+C+D)>>2, where A, B, C and D are unsigned 8-bit integers. First, in step 402, the values A, B, C and D are moved into 16-bit storage locations so that their addition can be performed using 16 bits to avoid overflow errors. Then, in step 404, the numbers A, B, C and D are summed. Next, in step 406, the sum is right-shifted by two bits. Finally, in step 408 the result is stored in an 8-bit storage location.

An example of computer code (Intel™ IA-32 assembly language) that implements the function (A+B+C+D)>>2 according to conventional methods (i.e., FIG. 7) is provided below. In this example computer code, 8-bit integers A1, A2, . . . are packed into register mm0, 8-bit integers B1, B2, . . . are packed into register mm1, 8-bit integers C1, C2, . . . are packed into register mm2, and 8-bit integers D1, D2, . . . are packed into register mm3. The values (A1+B1+C1+D1)>>2, (A2+B2+C2+D2)>>2, . . . are calculated and stored as packed 8-bit integers:

| movq | mm4, mm0 | ;//mm4 = A |
|---|---|---|
| punpcklbw | mm0, 0 | ;//unpack the lower 4 bytes into ;//mm0 |
| punpckhbw | mm4, 0 | ;//unpack the higher 4 bytes into ;//mm4 |
| movq | mm5, mm1 | ;//mm = B |

-continued

| punpcklbw | mm 1, 0 | ;//unpack the lower 4 bytes into ;//mm1 |
|---|---|---|
| punpckhbw | mm5, 0 | ;//unpack the higher 4 bytes into ;//mm5 |
| movq | mm6, mm2 | ;//mm6 = C |
| punpcklbw | mm2, 0 | ;//unpack the lower 4 bytes into ;// mm2 |
| punpckhbw | mm6, 0 | ;//unpack the higher 4 bytes into ;// mm6 |
| movq | mm7, mm3 | ;//mm7 = D |
| punpcklbw | mm3, 0 | ;//unpack the lower 4 bytes into ;// mm3 |
| punpckhbw | mm7, 0 | ;//unpack the higher 4 bytes into ;//mm7 |
| paddsw | mm0, mm1 | ;//mm0 = A+B (lower 4 bytes) |
| paddsw | mm0, mm2 | ;//mm0 = A+B+C (lower) |
| paddsw | mm0, mm3 | ;//mm0 = A+B+C+D (lower) |
| paddsw | mm4, mm5 | ;//mm4 = A+B (upper 4 bytes) |
| paddsw | mm4, mm6 | ;//mm4 = A+B+C (upper) |
| paddsw | mm4, mm7 | ;//mm4 = A+B+C+D (upper) |
| psrlw | mm0, 2 | ;//mm0 = mm0 >> 2 |
| psrlw | mm4, 2 | ;//mm4 = mm4 >> 2 |
| packuswb | mm0, mm4 | ;//pack words into bytes of mm0 |

As can be seen in this example, 21 instructions are used to compute (A+B+C+D)>>2.

Similarly, an example of computer code (Intel™ IA-32 assembly language) that implements the function (A+B+C+D+1)>>2 according to conventional methods is provided below. The values (A1+B1+C1+D1+1)>>2, (A2+B2+C2+D2+1)>>2, . . . are calculated and stored as packed 8-bit integers:

| movq | mm4, mm0 | ;//mm4 = A |
|---|---|---|
| punpcklbw | mm0, 0 | ;//unpack the lower 4 bytes into ;//mm0 |
| punpckhbw | mm4, 0 | ;//unpack the higher 4 bytes into ;//mm4 |
| movq | mm5,mm1 | ;//mm5=B |
| punpcklbw | mm 1, 0 | ;//unpack the lower 4 bytes into ;//mm1 |
| punpckhbw | mm5, 0 | ;//unpack the higher 4 bytes into ;//mm5 |
| movq | mm6, mm2 | ;//mm6 =C |
| punpcklbw | mm2, 0 | ;//unpack the lower 4 bytes into ;//mm2 |
| punpckhbw | mm6, 0 | ;//unpack the higher 4 bytes into ;// mm6 |
| movq | mm7, mm3 | ;//mm7 =D |
| punpcklbw | mm3, 0 | ;//unpack the lower 4 bytes into ;//mm3 |
| punpckhbw | mm7, 0 | ;//unpack the higher 4 bytes into ;//mm7 |
| paddsw | mm0, mm1 | ;//mm0 = A + B (lower 4 bytes) |
| paddsw | mm0, mm2 | ;//mm0 = A + B + C (lower) |
| paddsw | mm0, mm3 | ;//mm0 = A + B + C + D (lower) |
| paddsw | mm0,mm_0101 | ;//mm0=A+B+C+D+1 (lower) |
| paddsw | mm4, mm5 | ;//mm4 = A + B (upper 4 bytes) |
| paddsw | mm4, mm6 | ;//mm4 = A + B + C (upper) |
| paddsw | mm4, mm7 | ;//mm4 = A + B + C + D (upper) |
| paddsw | mm4,mm_0101 | ;//mm4=A +B +C +D +1 (upper) |
| psrlw | mm0,2 | ;//mm0 = m0 >> 2 |
| psrlw | mm4,2 | ;//mm4 = mm4 >> 2 |
| packuswb | mm0, mm4 | ;//pack words into bytes of mm0 |

As can be seen in this example, 23 instructions are used to compute (A+B+C+D+1)>>2.

Figure 8:
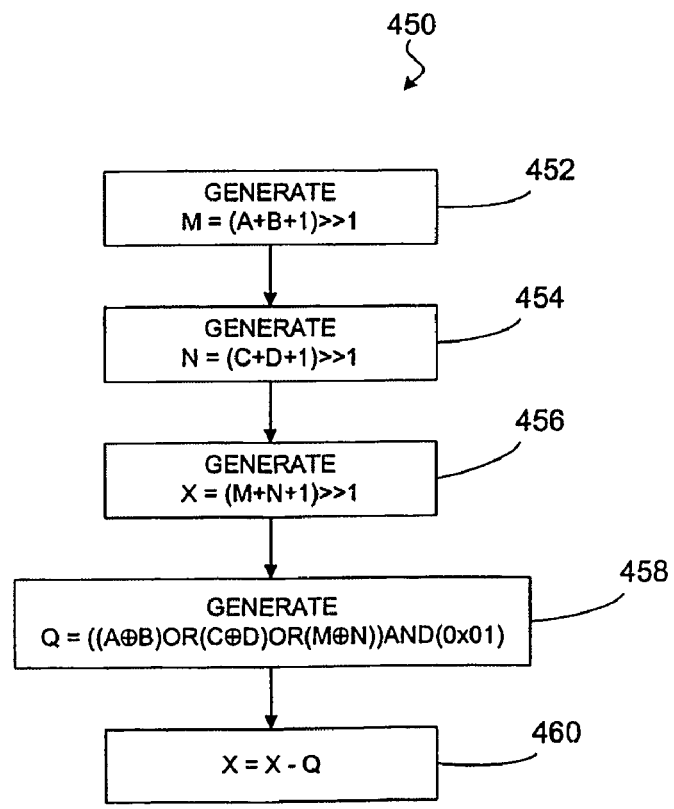
FIG. 8 is a simplified flow diagram of a method for generating an interpolation between four fixed-point values A, B, C and D according to one embodiment of the invention.

FIG. 8 is a simplified flow diagram illustrating another embodiment according to the present invention. Particularly, FIG. 8 illustrates a method 450 for generating an interpolation between four integers A, B, C and D according to the desired function (A+B+C+D)>>2. In step 452, a value, M, is generated as (A+B+1)>>1, and in step 454, a value, N, is generated as (C+D+1)>>1. Then, in step 456, an approximation, X, of the desired average is computed as (M+N+1)>>1. In step 458, a correction, Q, is generated as:

$$Q=((A\oplus B)OR(C\oplus D)OR(M\oplus N))AND(0x01) \quad (1)$$

where "OR" indicates a bit-wise OR operation. Then, in step 460, the correction Q is subtracted from the approximation X to generate the interpolation according to the desired function (A+B+C+D)>>1.

An example of computer code (Intel™ IA-32 assembly language) that implements the flow illustrated in FIG. 8 is provided below. In this example computer code, 8-bit integers A1, A2, . . . are packed into register mm0, 8-bit integers B 1, B2, . . . are packed into register mm 1, 8-bit integers C1, C2, . . . are packed into register mm2, and 8-bit integers D1, D2, . . . are packed into register mm3. The values (A1+B1+C1+D1)>>2, (A2+B2+C2+D2)>>2, . . . are calculated and stored as packed 8-bit integers:

```
movq    mm4, mm0       ;//mm4 = A
pxor    mm4, mm1       ;//mm4=A⊕B
movq    mm5, mm2       ;//mm5 = C
pxor    mm5, mm3       ;//mm5 = C⊕D
por     mm4, mm5       ;//mm4 = (A⊕B) OR (C⊕D)
pavgb   mm0,mm1        ;//mm0 = M = (A + B + 1) >> 1
pavgb   mm2,mm3        ;//mm2=N=(C+D+1)>>1
movq    mm1,mm0        ;//mm1=M
pxor    mm1,mm2        ;//mm1= M⊕N
por     mm1, mm4       ;//mm1 = (A⊕B) OR(C⊕D)
                       ;         OR(M⊕N)
pand    mm1, mm_0101   ;//mm1 =((A⊕B) OR(C⊕D)
                       ;        OR (M⊕N)) AND 0x01
pavgb   mm0, mm2       ;//mm0=X=(M+N+1)>>1
psubb   mm0, mm1       ;//mm0=X - Q
``` where mm__0101 is the constant that includes packed 8-bit values 0x01, for eight packed integers, mm__0101 is 0x0001010000010101. As can be seen in this example, 13 instructions are used to compute (A+B+C+D)>>1. In comparison, the conventional computer code example described above with respect to FIG. 7 required 21 instructions. Thus, this embodiment provides an approximate speed improvement of 60% (21 instructions/13 instructions).

Figure 9:
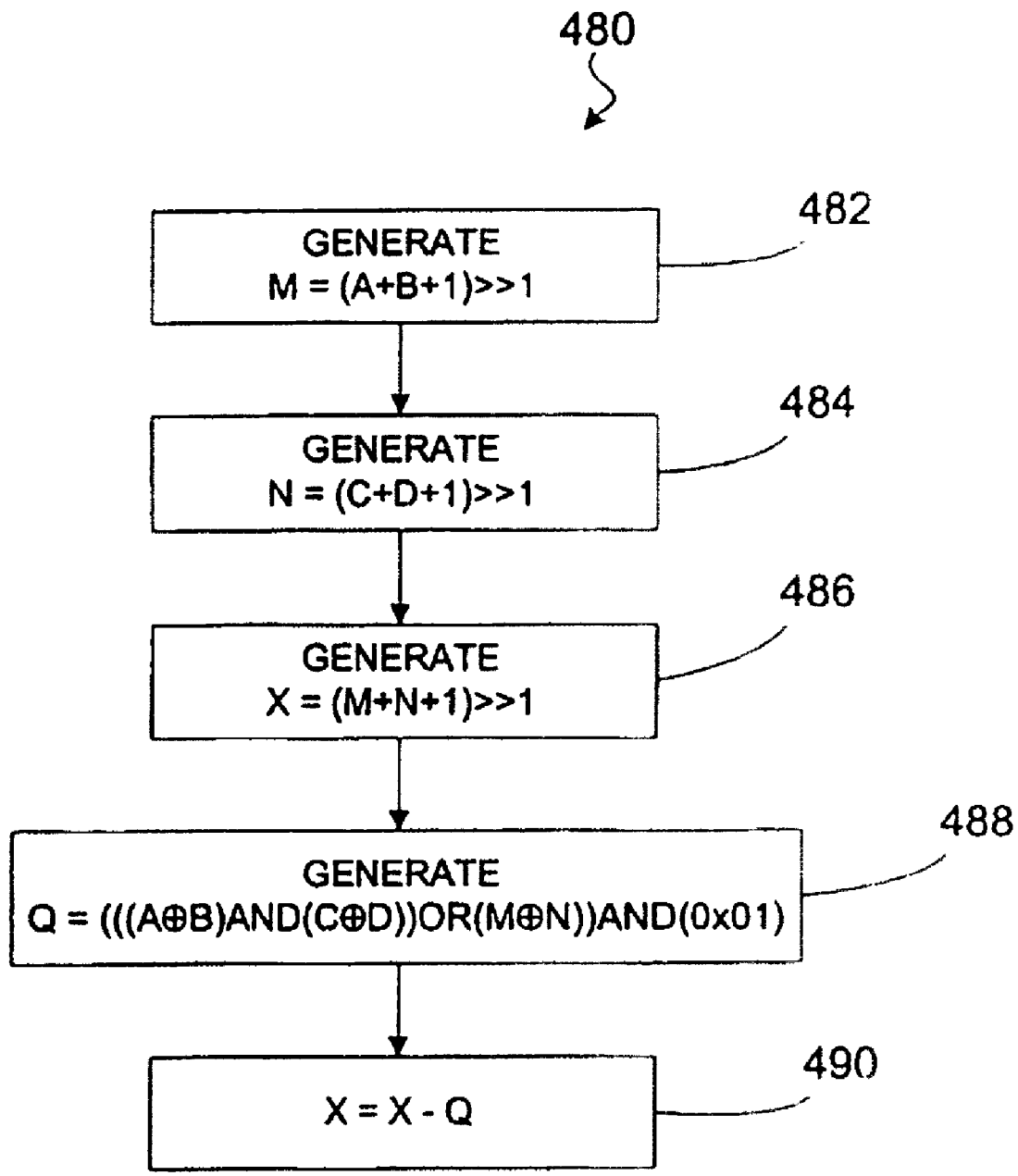
FIG. 9 is a simplified flow diagram of a method for generating an interpolation between four integers A, B, C and D according to another embodiment of the invention.

FIG. 9 is a simplified flow diagram illustrating yet another embodiment according to the present invention. Particularly, FIG. 9 illustrates a method 480 for generating an interpolation between four integers A, B, C and D according to the desired function (A+B+C+D+1)>>2. In step 482, a value, M, is generated as (A+B+1)>>1, and in step 484, a value, N, is generated as (C+D+1)>>1. Then, in step 486, an approximation, X, of the desired average is computed as (M+N+1)>>1. In step 488, a correction, Q, is generated as:

$$Q=(((A\oplus B)AND(C\oplus D))OR(M\oplus N))AND(0x01) \quad (2)$$

where "OR" indicates a bit-wise OR operation. Then, in step 490, the correction Q is subtracted from the approximation X to generate the interpolation according to the desired function (A+B+C+D+1)>>1.

An example of computer code (Intel™ IA-32 assembly language) that implements the flow illustrated in FIG. 9 is provided below. In this example computer code, 8-bit integers A1, A2, . . . are packed into register mm0, 8-bit integers B 1, B2, . . . are packed into register mm1, 8-bit integers C1, C2, . . . are packed into register mm2, and 8-bit integers D1, D2, . . . are packed into register mm3. The values (A1+B1+C1+D1+1)>>2, (A2+B2+C2+D2+2)>>2, . . . are calculated and stored as packed 8-bit integers:

```
movq    mm4, mm0        ;//mm4 = A
pxor    mm4, mm1        ;//mm4 = A⊕B
movq    mm5, mm2        ;//mm5 = C
pxor    mm5, mm3        ;//mm5= C⊕D
pand    mm4, mm5        ;//mm4(A⊕B)AND(C⊕D)
pavgb   mm0, mm1        ;//mm0 = M = (A + B + 1) >> 1
pavgb   mm2, mm3        ;//mm2 = N = (C + D + 1) >> 1
movq    mm1, mm0        ;//mm1 =M
pxor    mm1, mm2        ;//mm1=M⊕N
por     mm1, mm4        ;//mm1 = ((A⊕B)AND
                        ;//       (C⊕D))OR
                        ;//       (M⊕N)
pand    mm1,mm_0101     ;//mm1 = (A⊕B)AND
                        ;//       (C⊕D))OR
                        ;//       (M⊕N) AND 0x01
pavgb   mm0, mm2        ;//mm0 = X = (M+N + 1) >> 1
psubb   mm0,mm1         ;//mm0 = X - Q
``` where mm__0101 is the constant that includes packed 8-bit values 0x01. As can be seen in this example, 13 instructions are used to compute (A+B+C+D+1)>>1. In comparison, the conventional computer code example described above required 23 instructions. Thus, this embodiment provides an approximate speed improvement of 80% (23 instructions/13 instructions).

Efficient Implementation of Other Filtering Functions

The above-described embodiments have been described in the context of interpolation of pixel values. It is to be understood, however, that the above-described embodiments can be used in other contexts as well. For instance, the above-described embodiments can be used to implement various filtering functions for various types of data (e.g., video, audio, seismic, communications, etc.).

1. F=K(A+B+1)>>N

Other embodiments provide efficient implementations of other functions useful for filtering data. One such function is:

$$F=K(A+B+1)>>N \quad (3)$$

where A and B are unsigned integers, K and N are unsigned fixed-point filtering parameters. This function is useful, for example, in video filtering and interpolation, image re-sizing, etc.

Figure 10:
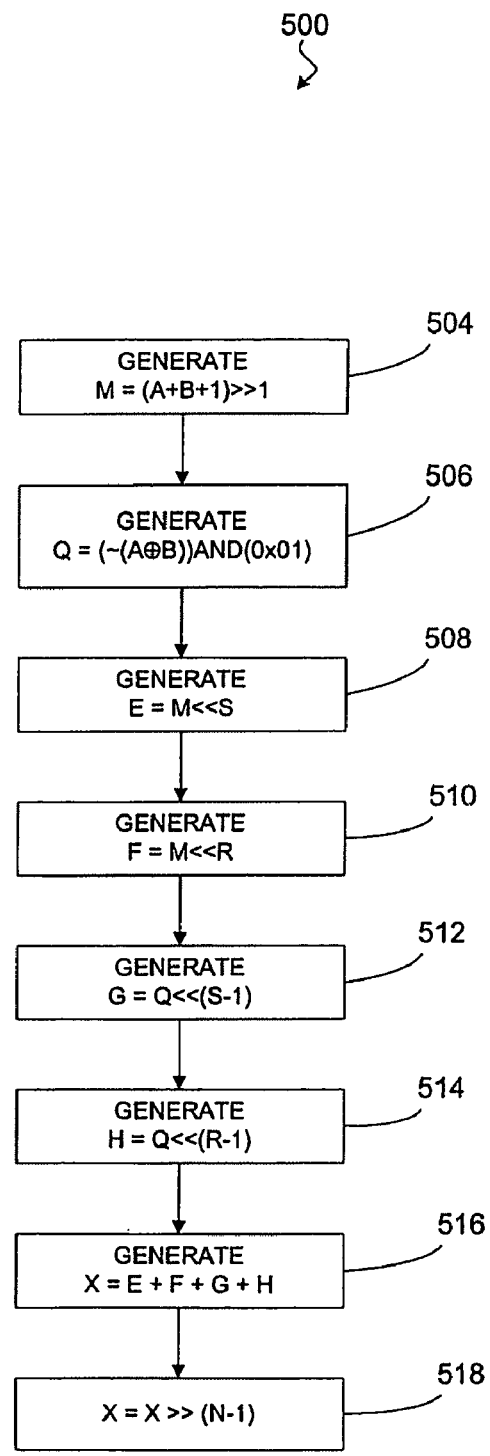
FIG. 10 is a simplified flow diagram of a method for filtering digital samples according to one embodiment of the invention.

FIG. 10 is a simplified flow diagram illustrating yet another embodiment according to the present invention. Particularly, FIG. 10 illustrates a method 500 for implementing the function set forth in equation (3) where K can be represented as 2 (S)+2 (R), where S and R are unsigned integers, and where S>R. It has been determined experimentally that this embodiment generates error-free results when the values A, B, and K are integers within the range [0, 255], and where N is a fixed point number within the range [0, 7]. It is to be understood, however, that this embodiment may produce accurate results for different ranges as well.

In step 504, the value M is generated according to the function M=(A+B+1)>>1. In implementations in which an IA-32 processor is used, M can be generated using a PAVGB or PAVGW instruction. In step 506, a value Q is generated as $$Q=(\sim(A\oplus B))AND(0x01) \quad (4)$$

where the symbol "~" indicates a bit-wise complement.

In step 508, a value E is generated as M<<S, where "<<S" indicates a left-shift by S bits. Similarly, in step 510, a value F is generated as M<<R. In step 512, a value G is generated as Q<<(S−1), and, in step 514, a value H is generated as Q<< (R−1). Then, in step 516, X is calculated as the sum of E, F, G and H. Finally, in step 518, X is right-shifted by (N−1) bits to generate the desired result.

Figure 11:
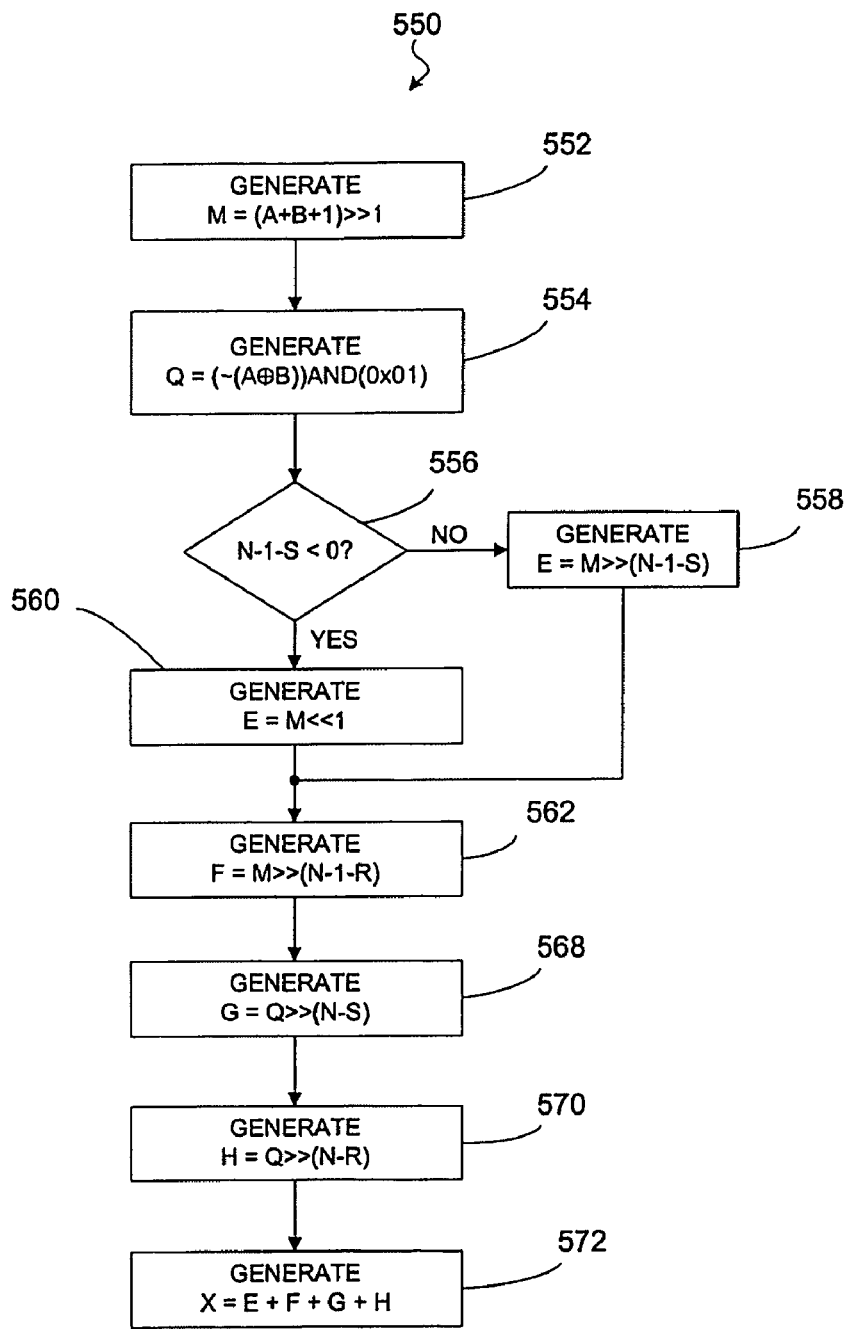
FIG. 11 is a simplified flow diagram of a method for filtering digital samples according to another embodiment of the invention.

FIG. 11 is a simplified flow diagram illustrating still another embodiment according to the present invention.

Similar to FIG. 10, FIG. 11 illustrates a method 550 for implementing the function set forth in equation (3) where K can be represented as 2 (S)+2 (R), where S and R are unsigned integers, and where S>R. Also similar to FIG. 10, the values A, B, and K are integers within the range [0, 255], and where N is a fixed point number within the range [0, 7]. But FIG. 11 illustrates a more efficient method 550 for implementing the function set forth in equation (3) when (A+B+1)<256, and when S≦N.

In steps 552 and 554, the values M and Q are generated as described with respect to steps 504 and 506, respectively, of FIG. 10. In step 556, it is determined whether (N−1−S) is less than zero. If NO, then the flow proceeds to step 558, where the value E is generated as M>>(N−1−S). If YES, then the flow proceeds to step 560, where the value E is generated as M<<1. Next, in step 562, the value F is generated as M>>(N−1−R). In step 568, a value G is generated as Q>>(N−S), and, in step 570, a value H is generated as Q>>(N−R). Finally, in step 572, X is calculated as the sum of E, F, G and H.

It has been found that in implementations using an IA-32 processor, the method described with respect to FIG. 11 provides an approximate speed advantage of 140% as compared to a traditional implementation.

2.  F=(40(A+B+1)−12(C+D+1)+6(E+F+1)−2(G+H+1))>>6

Another useful function that is commonly used for quarter-pixel interpolation in MPEG-4 video encoding is:

$$F=(40(A+B+1)-12(C+D+1)+6(E+F+1)-2(G+H+1))>>6 \quad (5)$$

where A, B, C, D, E, F, G, and H are unsigned integers.

Figure 12:
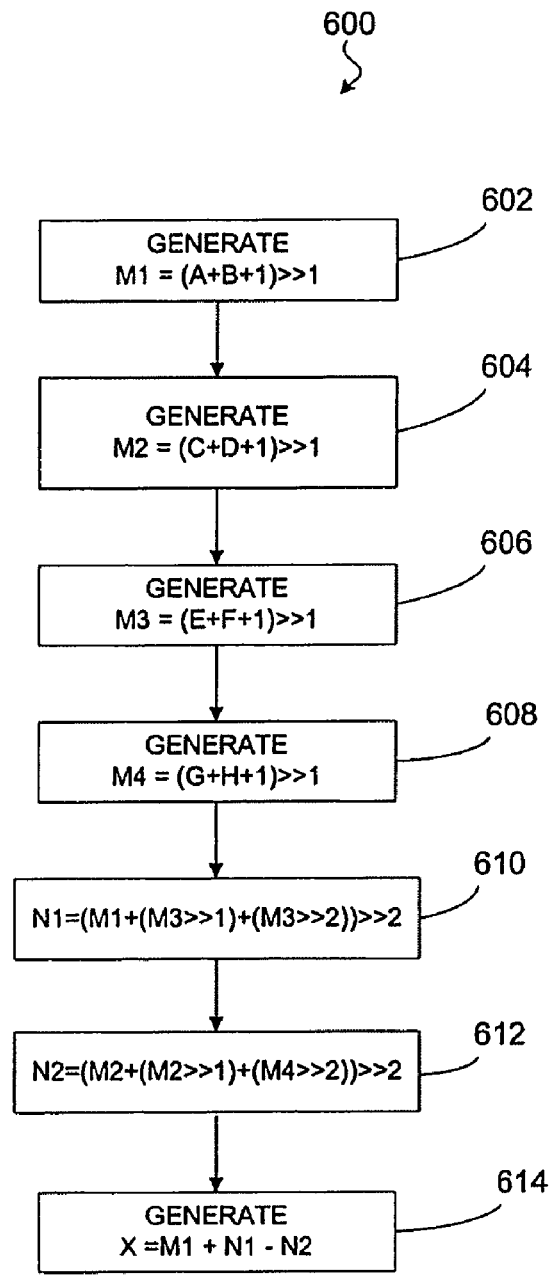
FIG. 12 is a simplified flow diagram of a method for filtering digital samples according to yet another embodiment of the invention.

FIG. 12 is a simplified flow diagram illustrating another embodiment according to the present invention. Particularly, FIG. 12 illustrates an embodiment of a method 600 for implementing the function set forth in equation (5). It has been determined via experimentation that, for 8-bit values, the method 600 generates correct results 60% of the time, errors of value one 30.5% of the time, and errors of value two 0.5% of the time.

In steps 602, 604, 606 and 608, values M1, M2, M3 and M4 are generated as (A+B+1)>>1, (C+D+1)>>1, (E+F+1)>>1, and (G+H+1)>>1, respectively. If the method 600 is implemented in an IA-32 processor, steps 602, 604, 606 and 608 can be performed, for example, using packed average instructions.

Next, in step 610, value N1 is generated as (M1+(M3>>1)+(M3>>2))>>2. In step 612 value N2 is generated as (M2+(M2>>1)+(M4>>2))>>2. Finally, in step 614, approximate result X is generated as M1+N1−N2. X is approximate in that, as described above, X may differ from the desired result for certain values of A, B, C, D, E, F, G and H. An example of IA-32 assembly language code for implementing the embodiment described with respect to FIG. 12 is provided in the attached appendix.

3.  F=(A+B+2)>>1

Figure 13:
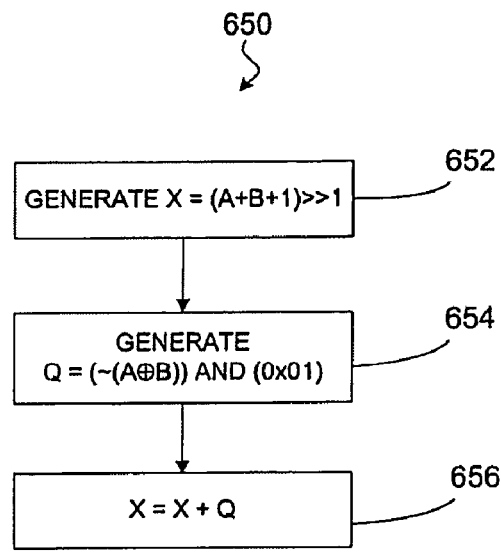
FIG. 13 is a simplified flow diagram of a method for filtering digital samples according to the function $(A+B+2)>>1$, according to another embodiment of the invention.

FIG. 13 is a simplified flow diagram illustrating another specific embodiment according to the present invention. Particularly, FIG. 13 illustrates a method 650 for generating a value based on two integers A and B according to the desired function (A+B+2)>>1. This embodiment can be useful, for example, as a step in carrying out a more complex filtering function.

In step 652, an approximation, X, of (A+B+2)>>1 is generated as (A+B+1)>>1. In step 654, a correction, Q, is generated as the bit-wise complement of (hereinafter referred to as "A") A⊕B, and further bit-wise ANDed with the mask 0x01. Then, in step 656, the correction Q is added to the approximation X to generate the result of the desired function (A+B+2)>>1.

An example of computer code (Intel™ IA-32 assembly language) that implements the flow illustrated in FIG. 13 is provided in the Appendix. This specific embodiment provides an approximate speed improvement over traditional techniques of approximately 160% (13 instructions/5 instructions).

4.  F=(2A+2B+1)>>2

It has been found that the value (2A+2B+1)>>2 can be calculated according to the embodiment described with respect to FIG. 6 (i.e., calculating the value (A+B)>>1). This embodiment can be useful, for example, as a step in carrying out a more complex filtering function.

5.  F=(2A+B+C+1)>>2

Figure 14:
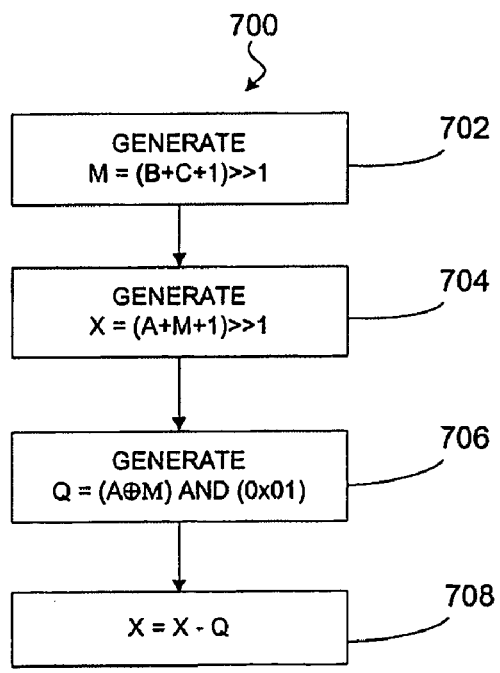
FIG. 14 is a simplified flow diagram of a method for filtering digital samples according to the function $(2A+B+C+1)>>2$, according to another embodiment of the invention.

FIG. 14 is a simplified flow diagram illustrating another specific embodiment according to the present invention. Particularly, FIG. 14 illustrates a method 700 for generating a value based on three integers A, B and C according to the desired function (2A+B+C+1)>>2. This embodiment can be useful, for example, as a step in carrying out a more complex filtering function.

In step 702, a value M is generated as (B+C+1)>>. Then, in step 704, an approximation, X, is generated as (A+M+1)>>1. In step 706, a correction, Q, is generated as A⊕M, bit-wise ANDed with the mask 0x01. Next, in step 708, the correction Q is subtracted from the approximation X to generate the result of the desired function (2A+B+C+1)>>2.

An example of computer code (Intel™ IA-32 assembly language) that implements the flow illustrated in FIG. 14 is provided in the Appendix. This specific embodiment provides an approximate speed improvement over traditional techniques of approximately 230% (20 instructions/6 instructions).

6.  F=(3A+B+1)>>2

Figure 15:
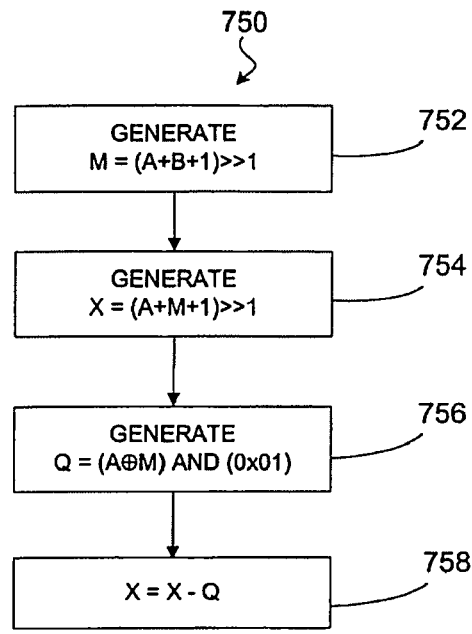
FIG. 15 is a simplified flow diagram of a method for filtering digital samples according to the function $(3A+B+1)>>2$, according to another embodiment of the invention.

FIG. 15 is a simplified flow diagram illustrating another specific embodiment according to the present invention. Particularly, FIG. 15 illustrates a method 750 for generating a value based on integers A and B according to the desired function (3A+B+1)>>2. This embodiment can be useful, for example, as a step in carrying out a more complex filtering function.

In step 752, a value M is generated as (A+B+1)>>1. Then, in step 754, an approximation, X, is generated as (A+M+1)>>1. In step 756, a correction, Q, is generated as A⊕M, bit-wise ANDed with the mask 0x01. Next, in step 758, the correction Q is subtracted from the approximation X to generate the result of the desired function (3A+B+1)>>2.

An example of computer code (Intel™ IA-32 assembly language) that implements the flow illustrated in FIG. 15 is provided in the Appendix. This specific embodiment provides an approximate speed improvement over traditional techniques of approximately 220% (19 instructions/6 instructions).

7.  F=(A+B+C+1)>>2

Figure 16:
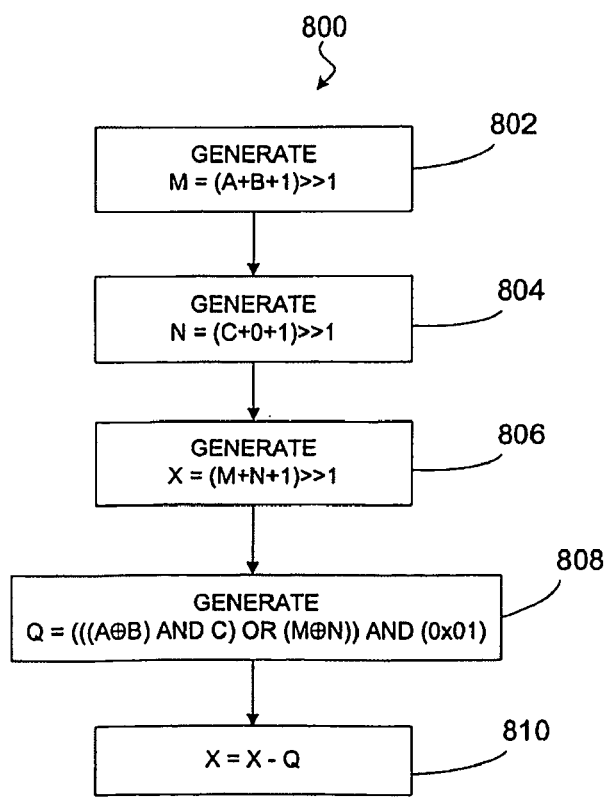
FIG. 16 is a simplified flow diagram of a method for filtering digital samples according to the function $(A+B+C+1)>>2$, according to another embodiment of the invention.

FIG. 16 is a simplified flow diagram illustrating another specific embodiment according to the present invention. Particularly, FIG. 16 illustrates a method 800 for generating a value based on three integers A, B and C according to the desired function (A+B+C+1)>>2. This embodiment can be useful, for example, as a step in carrying out a more complex filtering function.

In step 802, a value M is generated as (A+B+1)>>1. In step 804, a value N is generated as (C+0+1)>>1. Then, in step 806, an approximation, X, is generated as (M+N+1)>>1. In step 808, a correction, Q, is generated as:

$$Q=(((A \oplus B) \text{AND}(C)) \text{OR}(M \oplus N)) \text{AND}(0x01) \quad (6)$$

Next, in step 810, the correction Q is subtracted from the approximation X to generate the result of the desired function (A+B+C+1)>>2.

An example of computer code (Intel™ IA-32 assembly language) that implements the flow illustrated in FIG. 16 is provided in the Appendix. This specific embodiment provides an approximate speed improvement over traditional techniques of approximately 60% (18 instructions/11 instructions).

8. F=(2A+2B)>>2

It has been found that the value (2A+2B)>>2 can be calculated according to the embodiment described with respect to FIG. 6 (i.e., calculating the value (A+B)>>1). This embodiment can be useful, for example, as a step in carrying out a more complex filtering function.

9. F=(2A+B+C)>>2

Figure 17:
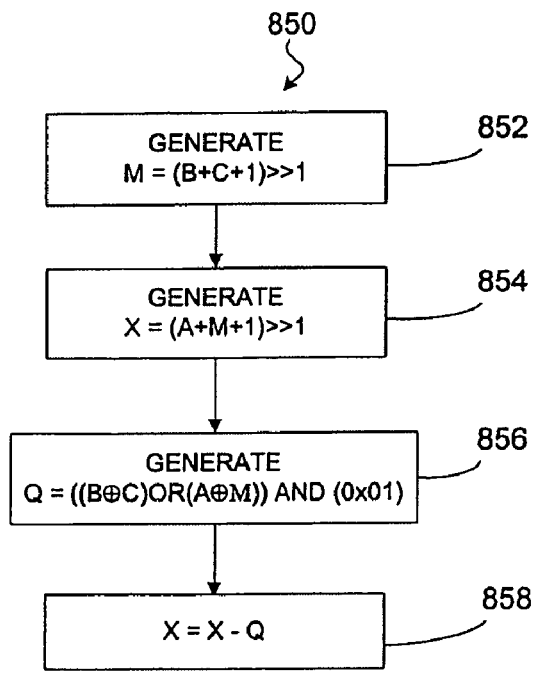
FIG. 17 is a simplified flow diagram of a method for filtering digital samples according to the function $(2A+B+C)>>2$, according to another embodiment of the invention.

FIG. 17 is a simplified flow diagram illustrating another specific embodiment according to the present invention. Particularly, FIG. 17 illustrates a method 850 for generating a value based on three integers A, B and C according to the desired function (2A+B+C)>>2. This embodiment can be useful, for example, as a step in carrying out a more complex filtering function.

In step 852, a value M is generated as (B+C+1)>>1. Then, in step 854, an approximation, X, is generated as (A+M+1)>>1. In step 856, a correction, Q, is generated as $$Q=((B \oplus C) \text{OR}(A \oplus M)) \text{AND}(0x01) \quad (7)$$

Next, in step 858, the correction Q is subtracted from the approximation X to generate the result of the desired function (2A+B+C)>>2.

An example of computer code (Intel™ IA-32 assembly language) that implements the flow illustrated in FIG. 17 is provided in the Appendix. This specific embodiment provides an approximate speed improvement over traditional techniques of approximately 100% (18 instructions/9 instructions).

10. F=(3A+B)>>2

Figure 18:
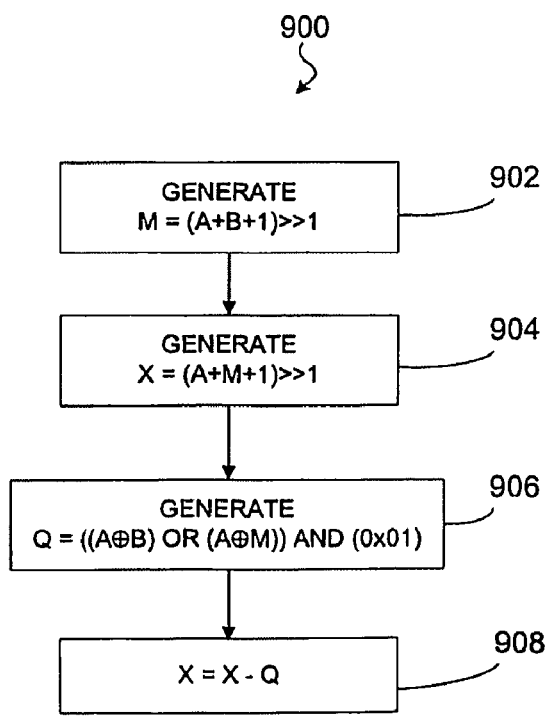
FIG. 18 is a simplified flow diagram of a method for filtering digital samples according to the function $(3A+B)>>2$, according to another embodiment of the invention.

FIG. 18 is a simplified flow diagram illustrating another specific embodiment according to the present invention. Particularly, FIG. 18 illustrates a method 900 for generating a value based on integers A and B according to the desired function (3A+B)>>2. This embodiment can be useful, for example, as a step in carrying out a more complex filtering function.

In step 902, a value M is generated as (A+B+1)>>1. Then, in step 904, an approximation, X, is generated as (A+M+1)>>1. In step 906, a correction, Q, is generated as $$Q=((A \oplus B) \text{OR}(A \oplus M)) \text{AND}(0x01) \quad (8)$$

Next, in step 908, the correction Q is subtracted from the approximation X to generate the result of the desired function (3A+B)>>2.

An example of computer code (Intel™ IA-32 assembly language) that implements the flow illustrated in FIG. 18 is provided in the Appendix. This specific embodiment provides an approximate speed improvement over traditional techniques of approximately 40% (13 instructions/9 instructions).

11. F=(A+B+C)>>2

Figure 19:
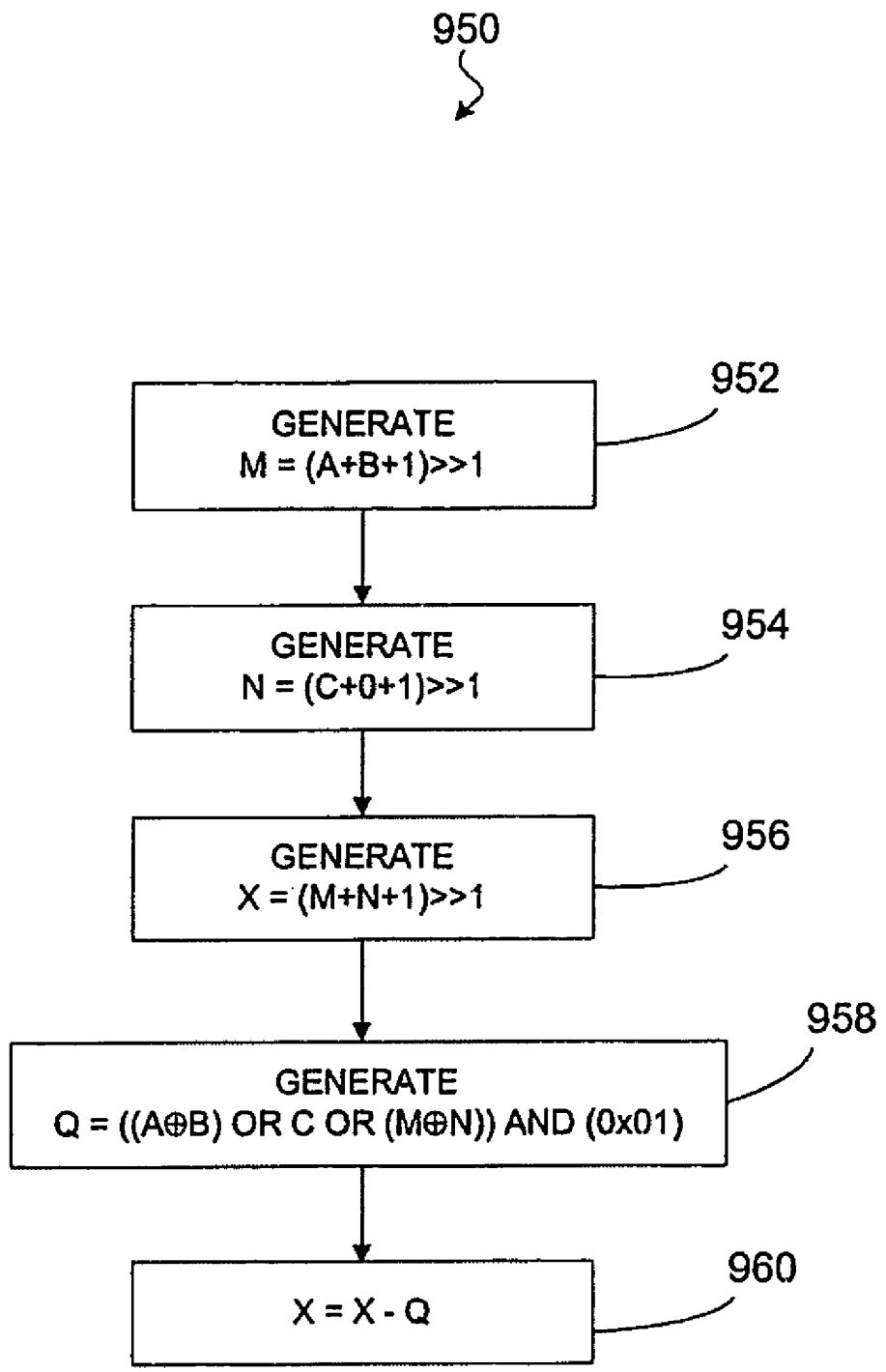
FIG. 19 is a simplified flow diagram of a method for filtering digital samples according to the function $(A+B+C)>>2$, according to another embodiment of the invention.

FIG. 19 is a simplified flow diagram illustrating another specific embodiment according to the present invention. Particularly, FIG. 19 illustrates a method 950 for generating a value based on three integers A, B and C according to the desired function (A+B+C)>>2. This embodiment can be useful, for example, as a step in carrying out a more complex filtering function.

In step 952, a value M is generated as (A+B+1)>>1. In step 954, a value N is generated as (C+0+1)>>1. Then, in step 956, an approximation, X, is generated as (M+N+1)>>1. In step 958, a correction, Q, is generated as:

$$Q=((A \oplus B) \text{OR } C \text{ OR}(M \oplus N)) \text{AND}(0x01) \quad (9)$$

Next, in step 960, the correction Q is subtracted from the approximation X to generate the result of the desired function (A+B+C)>>2.

An example of computer code (Intel™ IA-32 assembly language) that implements the flow illustrated in FIG. 19 is provided in the Appendix. This specific embodiment provides an approximate speed improvement over traditional techniques of approximately 50% (16 instructions/11 instructions).

Variations

The above-described embodiments have been described with reference to specific implementations using an Intel™ processor with MMX™/SSE. It is to be understood, however, that various embodiments may be implemented with other processors as well. For example, any processor that provide an instruction for calculating (A+B+1)>>1 can be used. Further, some or all of the steps of a particular embodiment may also be implemented in hardware. Additionally, although embodiments according to the present invention were described in the context of integers, it is to be understood that other embodiments may be used with integers. One skilled in the art will recognize many other variations, alternatives, and equivalents.

In other embodiments of the present invention, combinations or sub-combinations of the above-disclosed invention can be advantageously made. The block diagrams of the architecture and the steps in the flow diagrams are grouped for ease of understanding. However it should be understood that combinations of blocks, additions of new blocks, re-arrangement of blocks, and the like are contemplated in alternative embodiments of the present invention.

The invention has now been explained with reference to specific embodiments. Other embodiments will be apparent to those of ordinary skill in the art. Therefore it is not intended that this invention be limited except as indicated by the appended claims.

APPENDIX

Source Code Listings

Function: (40(A+B+1)−1 2(C+D+1)+6(E+F+1)−2(G−+H+1))>>6

```
// Load a,b,c,d Arrays
mov     eax, aAPtr
mov     ebx, bAPtr
mov     ccx, cAPtr
mov     cdx, dAPtr
movq    mm0, [eax]
movq    mm2, [ebx]
movq    mm1, [ecx]
movq    mm3, [edx]
//Main Computation - 38 Instructions
pavgb   mm0, mm2          ://m0
pavgb   mm1, mm3          ://m1
//Load e,f,g,h Arrays
mov     eax, eAPtr
mov     ebx, fAPtr
mov     ccx, gAPtr
mov     cdx, hAPtr
movq    mm2, [eax]
```

-continued

```
movq     mm4, [ebx]
movq     mm3, [ecx]
movq     mm5, [edx]
pavgb    mm2, mm4              ;//m2
pavgb    mm3, mm5
movq     mm5, mm2
psrlq    mm5, 1
pand     mm5, mm_7F7F          ;//m2>>1
psrlq    mm2,2
pand     mm2, mm_3F3F          ;//m2>>2
movq     mm4, mm0
pxor     mm4, mm5
por      mm4, mm2
pavgb    mm5, mm0
pavgb    mm2, mm_0000
movq     mm6, mm5
pxor     mm6, mm2
por      mm4, mm6
pand     mm4, mm_0101
pavgb    mm5, mm2
psubb    mm5, mm4              ;//(m0+(m2>>1 )+(m2>>2))>>2
movq     mm2, mm1
psrlq    mm2, 1
pand     mm2, mmF7F            ;//m2>>1
psrlq    mm3, 2
pand     mm3, mm3F3F           ;//m2>>2
movq     mm4, mm1
pxor     mm4, mm2
por      mm4, mm3
pavgb    mm2, mm1
pavgb    mm3, mm_0000
movq     mm6, mm2
pxor     mm6, mm3
por      mm4, mm6
pand     mm4, mm_0101
pavgb    mm2, mm3
psubb    mm2, mm4
paddusb  mm0, mm5
psubusb  mm0, mm2
```

Function: (A+B+2')>>1

```
//Load a,b Arrays
movq    mm0, [eax]
movq    mm1, [ebx]
//Main Computation - 5 Instructions
movq    mm2, mm0     ;//mm2 = A
pxor    mm2, mm1     ;//mm2=A⊕B
pandn   mm2, 0x01    ;//mm2 = (~(A⊕B)) AND 0x01
pavgb   mm0, mm1     ;//mm0 = X = (A + B + 1)>>1
psub    mm0, mm2     ;//mm0 = X − Q
```

Function: (3A+B+1')>>2

```
// Load Arrays
movq    mm0, [eax]
movq    mm1, [ebx]
// Main Computation - 6 Instructions
pavgb   mm1, mm2
movq    mm3, mm0
pxor    mm3, mm1
pand    mm3, mm_0101
pavgb   mm0, mm1
psubb   mm0, mm3
```

Function: (A+B+C+1)>>2

```
//Load Arrays
movq    mm0, [eax]
movq    mm1, [ebx]
movq    mm2, [ecx]
```

-continued

```
//Main Computation - 11 Instructions
movq    mm3, mm0
pxor    mm3, mm1
por     mm3, mm2
pavgb   mm0, mm1
pavgb   mm2, mm_0000
movq    mm4, mm0
pxor    mm4, mm2
pand    mm3, mm4
pand    mm3, mm_0101
pavgb   mm0, mm2
psubb   mm0, mm3
```

Function: (2A+B+C)>>2

```
//Load Arrays
movq    mm0, [eax]
movq    mm1, [ebx]
movq    mm2, [ecx]
//Main Computation - 9 Instructions
movq    mm3, mm1
pxor    mm3, mm2
pavgb   mm1, mm2
movq    mm4, mm0
pxor    mm4, mm1
por     mm3, mm4
pand    mm3, mm_0101
pavgb   mm0, mm1
psubb   mm0, mm3
```

Function: (3A+B)>>2

```
// Load Arrays
movq    mm0, [eax]
movq    mm1, [ebx]
//Main Computation - 9 Instructions
movq    mm3, mm0
pxor    mm3, mm1
pavgb   mm1, mm0              ;//n=pavgb(a,b)
movq    mm4, mm0
pxor    mm4, mm1              ;//a^n
pavgb   mm0, mm1              ;//x=pavgb(a,n)
por     mm3, mm4
pand    mm3, mm_0101
psubb   mm0, mm3
```

Function: (A+B+C)>>2

```
//Load Arrays
movq    mm0, [eax]
movq    mm1, [ebx]
movq    mm2, [ecx]
//Main Computation - 11 Instructions
movq    mm3, mm0
pxor    mm3, mm1
por mm3,mm2
pavgb   mm0, mm1
pavgb   mm2, mm_0000
movq    mm4, mm0
pxor    mm4, mm2
por     mm3, mm4
pand    mm3, mm_0101
pavgb   mm0 mm2
psubb   mm0, mm3
```

What is claimed is:

1. A method for filtering in a signal processor of a video encoder, the method comprising:
   receiving an input digital signal at an input to the video encoder; extracting a plurality of samples from the received digital signal;
   generating an approximate filtered sample as a function of a first sample, A, a second sample, B, a third sample, C, and a fourth sample, D, wherein A, B, C, and D are fixed-point numbers;
   generating a correction as $((A \oplus B).AND.(C \oplus D).OR.(M \oplus N))$, wherein $M = A+B+1 >> 1$ and $N = C+D+1 >> 1$, wherein the ">>" represents a right-shift;
   masking the correction; and
   generating at an output of the video encoder a filtered sample by modifying the approximate filtered sample with the masked correction.

2. The method of claim 1, wherein generating the approximate filtered sample includes:
   calculating $M = A+B+1 >> 1$;
   calculating $N = C+D+1 >> 1$; and
   calculating the approximate filtered sample as $M+N+1 >> 1$.

3. The method of claim 2, wherein the signal processor is a microprocessor having an instruction for calculating the function $X+Y+1 >> 1$, wherein the calculating M is performed using the instruction, wherein the calculating N is performed using the instruction, and wherein the calculating the approximate filtered sample is performed using the instruction.

4. The method of claim 3, wherein the microprocessor is an Intel™ microprocessor with SSE or SSE2, and wherein the instruction is the PAVGB instruction.

5. The method of claim 3, wherein the microprocessor is an Intel™ microprocessor with SSE or SSE2, and wherein the instruction is the PAVGW instruction.

6. The method of claim 1, wherein the microprocessor is an Intel™ microprocessor with MMX™/SSE, wherein the A, B, C, and D are eight bit fixed-point numbers, wherein the steps of generating the approximate filtered sample, generating the correction, masking the correction and generating the filtered sample include executing the instructions:
   pxor A_REG, B_REG;
   pxor C_REG, D_REG;
   pand A_REG, C_REG;
   pavgb M_REG, B_REG;
   pavgb N_REG, D_REG;
   movq B_REG, M_REG;
   pxor B_REG, N_REG;
   pand B_REG, CONST;
   pavgb M_REG, N_REG;
   psubb M_REG, B_REG;
   wherein A_REG is a register that initially includes A, B_REG is a register that initially includes B, C_REG is a register that initially includes C, D_REG is a register that includes D, CONST is a constant that includes the eight-bit number 0x01, M_REG is a register that initially includes A, and N_REG is a register that initially includes C.

7. A method filtering in a signal processor of a video encoder, the method comprising:
   receiving an input digital signal at an input to the video encoder; extracting a plurality of samples from the received digital signal;
   generating an approximate filtered sample as a function of a first sample, A, a second sample, B, a third sample, C, and a fourth sample, D, wherein A, B, C, and D are fixed-point numbers;
   generating a correction as $((A \oplus B).OR.(C \oplus D)).OR.(M \oplus N)$, wherein $M = A+B+1 >> 1$ and $N = C+D+1 >> 1$, wherein the ">>" represents a right-shift;
   masking the correction; and
   generating at an output of the video encoder a filtered sample by modifying the approximate filtered sample with the masked correction.

8. The method of claim 7, wherein generating the approximate filtered sample includes:
   calculating $M = A+B+1 >> 1$;
   calculating $N = C+D+1 >> 1$; and
   calculating the approximate filtered sample as $M+N+1 >> 1$.

9. The method of claim 8, wherein the signal processor is a microprocessor having an instruction for calculating the function $X+Y+1 >> 1$, wherein the calculating M is performed using the instruction, wherein the calculating N is performed using the instruction, and wherein the calculating the approximate filtered sample is performed using the instruction.

10. The method of claim 9, wherein the microprocessor is an Intel™ microprocessor with SSE or SSE2, and wherein the instruction is the PAVGB instruction.

11. The method of claim 9, wherein the microprocessor is an Intel™ microprocessor with SSE or SSE2, and wherein the instruction is the PAVGW instruction.

12. The method of claim 7, wherein the microprocessor is an Intel™ microprocessor with MMX™/SSE, wherein the A, B, C, and D are eight bit numbers, wherein the generating the approximate filtered sample, generating the correction, masking the correction and generating the filtered sample include executing the instructions:
   pxor A_REG, B_REG;
   pxor C_REG, D_REG;
   por A_REG, C_REG;
   pavgb M_REG, B_REG;
   pavgb N_REG, D_REG;
   movq B_REG, M_REG;
   pxor B_REG, N_REG;
   pand B_REG, CONST;
   pavgb M_REG, N_REG;
   psubb M_REG, B_REG;
   wherein A_REG is a register that initially includes A, B_REG is a register that initially includes B, C_REG is a register that initially includes C, D_REG is a register that includes D, CONST is a constant that includes the eight-bit integer value one, M_REG is a register that initially includes A, and N_REG is a register that initially includes C.

13. A computer program product comprising:
   A non-transitory computer readable storage medium having computer program code embodied therein for quantizing a digital signal, the computer program code comprising;
   code for generating an approximate filtered sample as a function of a first sample, A, a second sample, B, a third sample, C, and a fourth sample, D, wherein A, B, C, and D are fixed-point numbers;
   code for generating a correction as $((A \oplus B).AND.(C \oplus D)).OR.(M \oplus N)$, wherein $M = A+B+1 >> 1$ and $N = C+D+1 >> 1$, wherein the ">>" represents a right-shift;
   code for masking the correction; and
   code for generating a filtered sample by modifying the approximate filtered sample with the masked correction.

14. A system for filtering samples in a digital signal, the system comprising:
  a memory that stores samples in the digital signal; and
  a processor coupled to the memory and operable to perform:
    generating an approximate filtered sample as a function of a first sample, A, a second sample, B, a third sample, C, and a fourth sample, D, wherein A, B, C, and D are fixed-point numbers;
    generating a correction as $((A \oplus B) \text{AND} (C \oplus D)) \text{OR} (M \oplus N)$, wherein $M=A+B+1 >> 1$ and $N=C+D+1 >> 1$, wherein the ">>" represents a right-shift;
    masking the correction; and
    generating a filtered sample by modifying the approximate filtered sample with the masked correction.

* * * * *